(12) United States Patent
Ohkubo

(10) Patent No.: US 6,225,835 B1
(45) Date of Patent: May 1, 2001

(54) AMPLIFIER FREE FROM DUTY-RATIO ERROR

(75) Inventor: Masashi Ohkubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/516,013

(22) Filed: Feb. 29, 2000

(30) Foreign Application Priority Data

Mar. 18, 1999 (JP) ................................... 11-074473

(51) Int. Cl.[7] ........................................................ H03K 5/22
(52) U.S. Cl. ............................... 327/77; 327/72; 327/309
(58) Field of Search .............................. 327/77, 72, 63, 327/65, 314, 309, 315, 333, 316, 318, 321, 323, 331, 332

(56) References Cited

U.S. PATENT DOCUMENTS

| | | | |
|---|---|---|---|
| 4,782,290 | * 11/1988 | Sakai et al. | 327/765 |
| 5,012,207 | * 4/1991 | Edwards | 324/166 |
| 5,408,529 | * 4/1995 | Greaves | 379/386 |

FOREIGN PATENT DOCUMENTS

| | | |
|---|---|---|
| 6-29796 | 2/1994 | (JP) . |
| 6-310967 | 11/1994 | (JP) . |

* cited by examiner

Primary Examiner—Tuan T. Lam
Assistant Examiner—Hiep Nguyen
(74) Attorney, Agent, or Firm—Arent Fox Kintner Plotkin & Kahn, PLLC

(57) ABSTRACT

A device for amplifying a signal includes a first amplifier which amplifies an input signal with reference to a reference voltage level to generate an amplified signal, a limiter circuit which limits an upper end of the amplified signal to a level twice as high as the reference voltage level so as to output a limited amplified signal, a second amplifier which amplifies the limited amplified signal with reference to an average of the limited amplified signal, and a comparator which compares an output of said second amplifier with the reference voltage level to output a result of the comparison.

10 Claims, 6 Drawing Sheets

US 6,225,835 B1

AMPLIFIER FREE FROM DUTY-RATIO ERROR

BACKGROUND OF THE INVENTION

1. Field of the Invention

The present invention generally relates to an amplifier, and particularly relates to an amplifier which can substantially avoid a duty-ratio error.

2. Description of the Related Art

As technology makes further progress in size reduction and lowering of power consumption of communication equipment, there is an increasing demand for circuits used in communication equipment to operate with low voltages. An IF (intermediate frequency) amplifier unit, which is generally provided at a stage prior to an FM demodulation unit, is required to provide a sufficient gain and a small waveform distortion under low-voltage conditions.

FIG. 1 is a circuit diagram of a related-art IF amplifier unit.

The IF amplifier unit of FIG. 1 includes amplifiers A1 and A2, a comparator C1, and resistors R1 through R5.

The amplifier A1 receives an input signal via resistor R1 at one input node when the input signal is supplied to an input terminal, and receives a reference voltage VSG at the other input node. The amplifier A1 amplifies the input signal with reference to the reference voltage VSG. The input node of the amplifier A1 that is connected to the resistor R1 is connected to an output node of the amplifier A1 via the resistor R2.

The signal amplified by the amplifier A1 takes two different routes to be input to the amplifier A2, one being through the resistor R3 and the other being through the resistor R4. The amplifier A2 serves to cancel an offset of the input signal relative to the reference voltage VSG. The input node of the amplifier A2 that is connected to the resistor R3 is connected to the output node of the amplifier A2 via the resistor R5. The other input node of the amplifier A2 that is connected to the resistor R4 is connected to the ground via a capacitor.

A signal output from the amplifier A2 is supplied to the comparator C1. The comparator C1 receives the reference voltage VSG in addition to the signal from the amplifier A2, and compares the signal with the reference voltage VSG to output a result of the comparison at its output node.

The IF amplifier unit of FIG. 1 exhibits problems when the input signal supplied to the input terminal exceeds a certain threshold voltage level.

FIGS. 2A through 2C are illustrative drawings of waveforms for explaining problems that arise when an input signal exceeds a threshold voltage level.

FIG. 2A shows an input signal together with a power voltage level and a ground voltage level where the input signal is supplied to the input terminal. As long as the input signal stays below a threshold voltage level, no problem is observed.

When the input signal exceeds the threshold voltage level, however, a signal output from the amplifier A1 behaves as shown in FIG. 2B. As shown in FIG. 2B, the output signal of the amplifier A1 has an average voltage level V2 that is different from the reference voltage VSG. This is because clamping occurs when the input signal to the input terminal exceeds the threshold voltage level. When the signal as shown in FIG. 2B is supplied to the amplifier A2, an output signal of the amplifier A2 behaves as shown in FIG. 2C.

Operating with reference to the reference voltage VSG, the comparator C1 produces an output signal that suffers a phase displacement amounting to a temporal displacement dT in comparison with an output signal that would be obtained when a difference between the average voltage level V2 and the reference voltage VSG is insignificant. This phase displacement leads to an error in a duty ratio.

Accordingly, there is a need for an IF amplifier which can reduce a difference between a reference voltage and an average voltage so as to suppress an error of a duty ratio.

SUMMARY OF THE INVENTION

Accordingly, it is a general object of the present invention to provide an amplifier which can satisfy the need described above.

It is another and more specific object of the present invention to provide an amplifier which can reduce a difference between a reference voltage and an average voltage so as to suppress an error of a duty ratio.

In order to achieve the above objects according to the present invention, a device for amplifying a signal includes a first amplifier which amplifies an input signal with reference to a reference voltage level to generate an amplified signal, a limiter circuit which limits an upper end of the amplified signal to a level twice as high as the reference voltage level so as to output a limited amplified signal, a second amplifier which amplifies the limited amplified signal with reference to an average of the limited amplified signal, and a comparator which compares an output of said second amplifier with the reference voltage level to output a result of the comparison.

In the amplifying device described above, the limiter circuit is situated between the first amplifier and the second amplifier so as to limit the amplified signal of the first amplifier to the level twice as high as the reference voltage level. This makes it possible to make an average voltage level of the signal input to the second amplifier substantially equal to the reference voltage level. That is, the limiter circuit serves to reduce a difference between the average voltage level and the reference voltage level. Such a reduction is useful in the communication technology since it prevents a displacement of signal phase.

According to one aspect of the present invention, the device as described above is such that the reference voltage level is lower than half of a power voltage level which drives the device.

In the configuration described above, use of the reference voltage level that is lower than half the power voltage level makes it possible to insure reliable operation even when the power voltage is lowered.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 3:
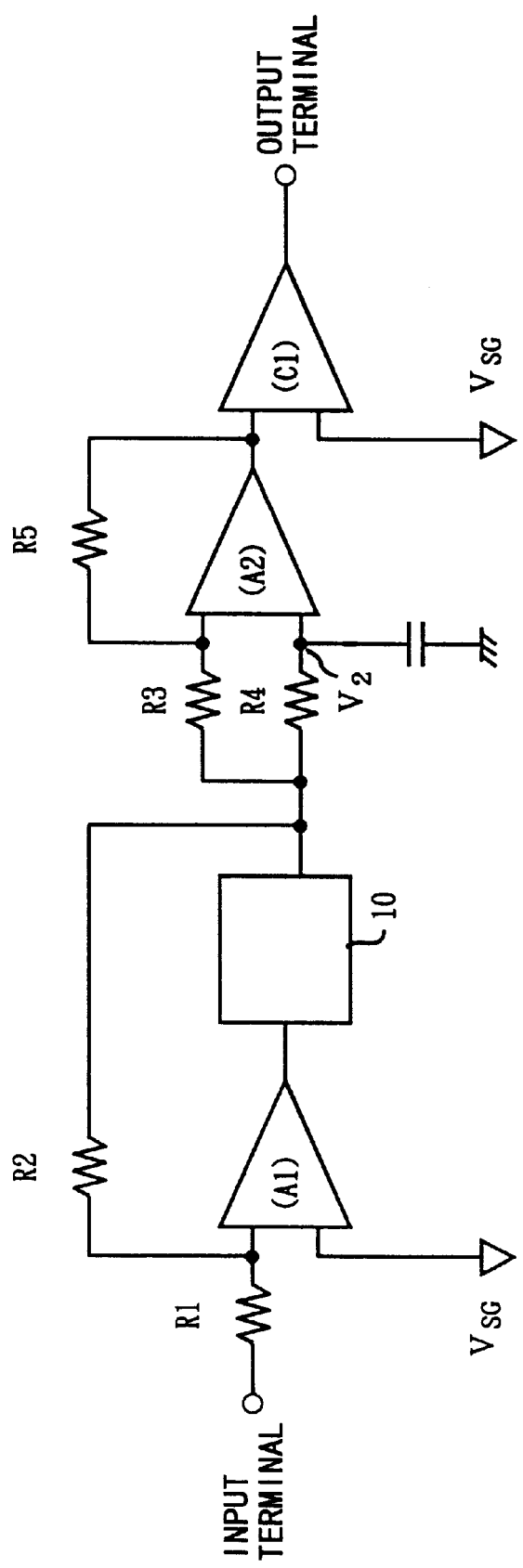
FIG. 3 is a circuit diagram of an IF amplifier according to an embodiment of the present invention.

FIG. 3 is a circuit diagram of an IF amplifier according to an embodiment of the present invention.

Figure 1:
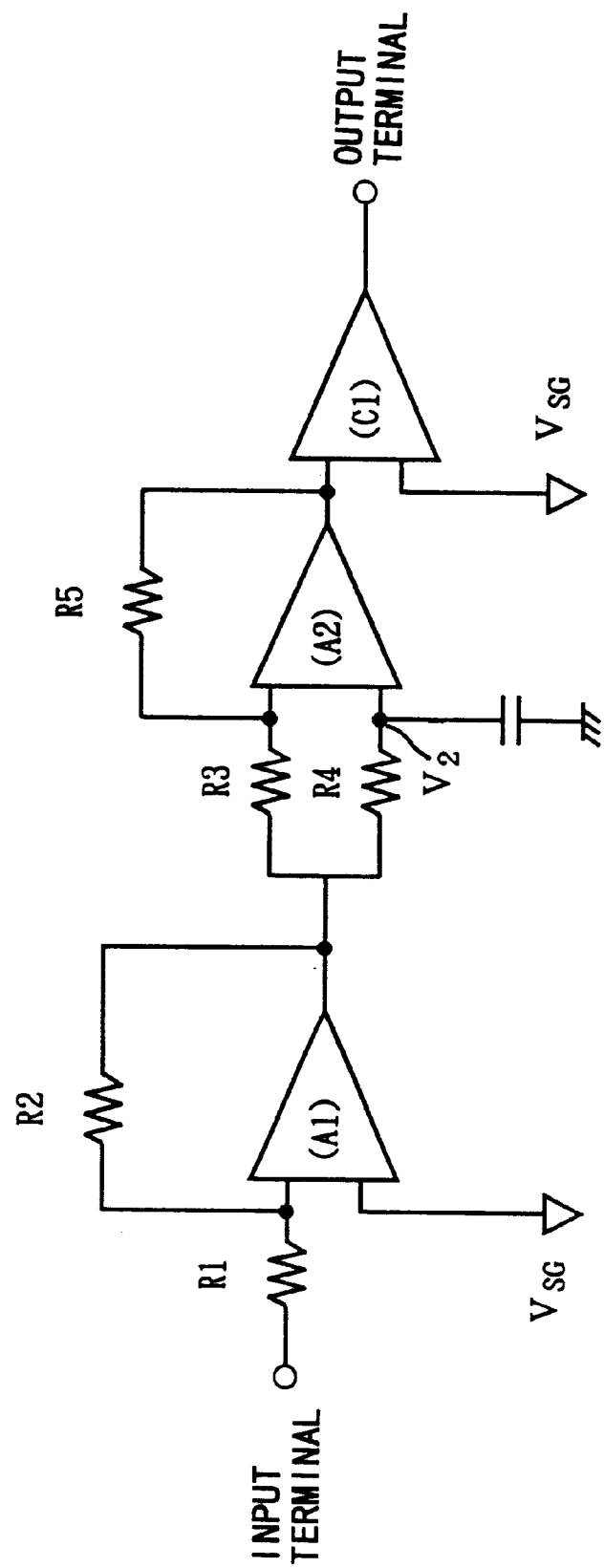
FIG. 1 is a circuit diagram of a related-art IF amplifier unit.
Figure 2:
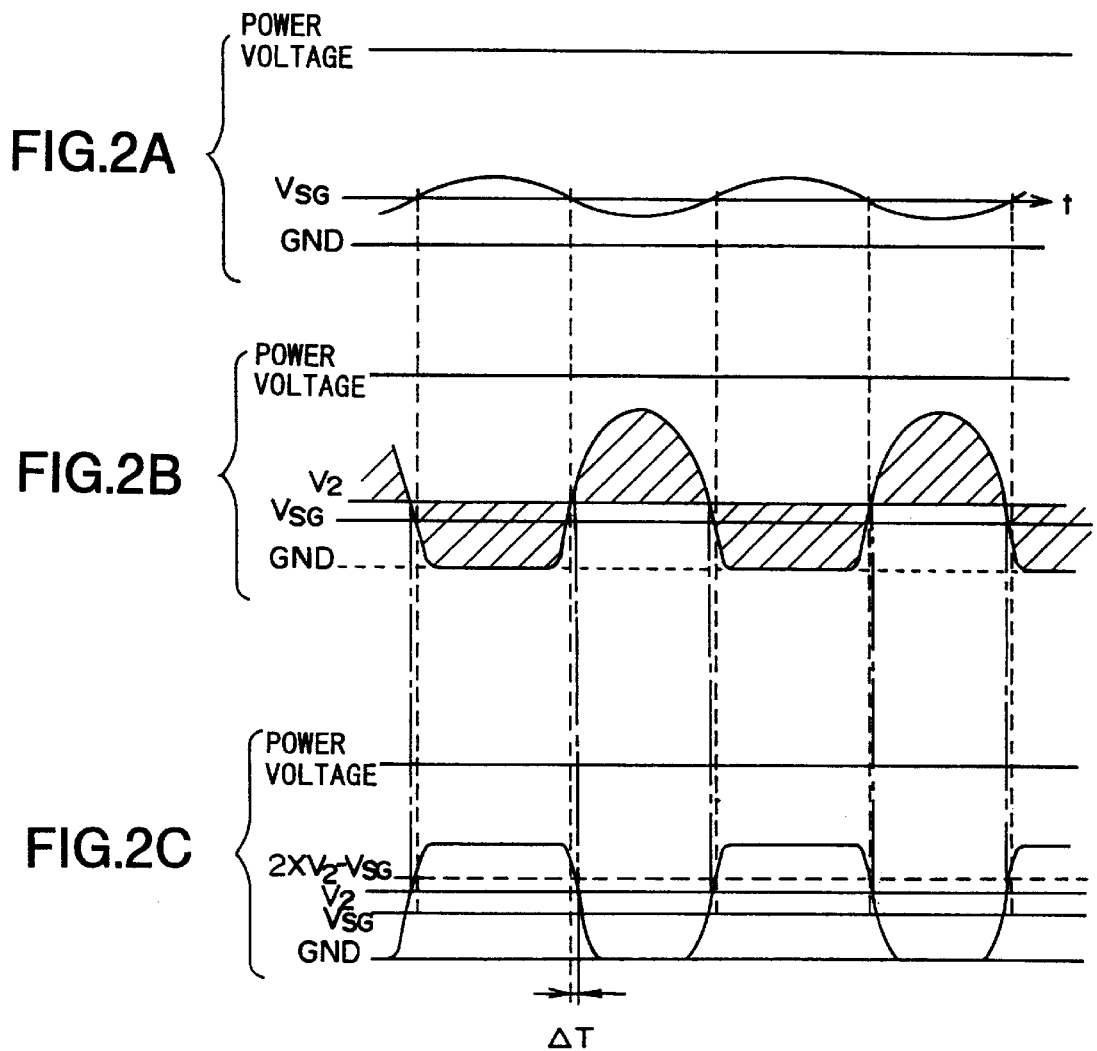
FIGS. 2A through 2C are illustrative drawings of waveforms for explaining problems that arise when an input signal exceeds a certain threshold voltage level.

A configuration FIG. 3 has a limiter circuit 10 inserted at the output of the amplifier A1 in addition to the configuration of FIG. 1. The IF amplifier unit of FIG. 3 includes the amplifiers A1 and A2, the comparator C1, the limiter circuit 10, and the resistors R1 through R5.

The amplifier A1 receives an input signal via resistor R1 at one input node when the input signal is supplied to an input terminal, and receives a reference voltage VSG at the other input node. The amplifier A1 amplifies the input signal with reference to the reference voltage VSG. The input node of the amplifier A1 that is connected to the resistor R1 is connected to an output node of the amplifier A1 via the resistor R2.

The signal amplified by the amplifier A1 is supplied to the limiter circuit 10. The limiter circuit 10 limits the signal supplied from the amplifier A1, and outputs a signal that is limited to a level that is twice the reference voltage VSG. The reason why such a signal limiting operation is carried out is that clamping occurs when the output signal of the amplifier A1 exceeds the level twice the reference voltage VSG.

Figure 4:
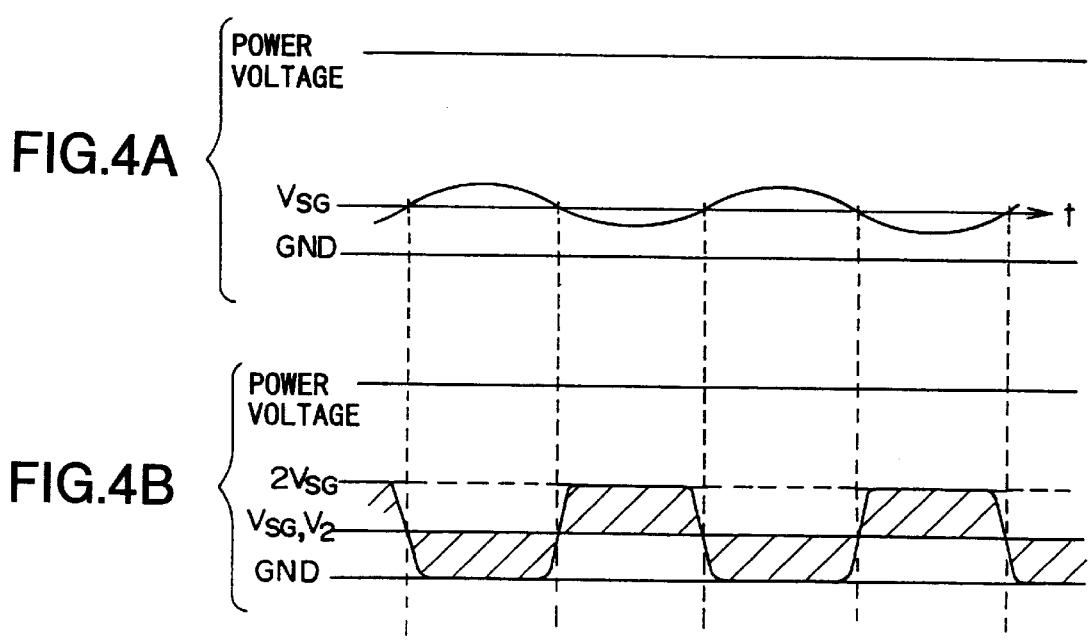
FIGS. 4A and 4B are illustrative drawing showing waveforms for explaining operation of a limiter circuit of FIG. 3.

FIGS. 4A and 4B are illustrative drawing showing waveforms for explaining operation of the limiter circuit of FIG. 3.

As shown in FIG. 4B, a signal output from the limiter circuit 10 is limited to the voltage level that is twice the reference voltage VSG, so that the average voltage level V2 becomes substantially the same as the reference voltage VSG.

Even when the input signal supplied to the input terminal exceeds a threshold voltage level that makes the output signal of the amplifier A1 clamped, the average voltage V2 stays at the substantially same level as the reference voltage VSG.

The signal amplified by the amplifier A1 takes two different routes to be input to the amplifier A2, one being through the resistor R3 and the other being through the resistor R4. The amplifier A2 serves to cancel an offset of the input signal relative to the reference voltage VSG. The input node of the amplifier A2 that is connected to the resistor R3 is connected to the output node of the amplifier A2 via the resistor R5. The other input node of the amplifier A2 that is connected to the resistor R4 is connected to the ground via a capacitor.

A signal output from the amplifier A2 is supplied to the comparator C1. The comparator C1 receives the reference voltage VSG in addition to the signal from the amplifier A2, and compares the signal with the reference voltage VSG to output a result of the comparison at its output node.

Since the average voltage level V2 is substantially the same as the reference voltage VSG, the output signal of the comparator C1 exhibits a duty-ratio error that is substantially reduced.

In the following, a description will be given with regard to a configuration of the limiter circuit 10.

Figure 5:
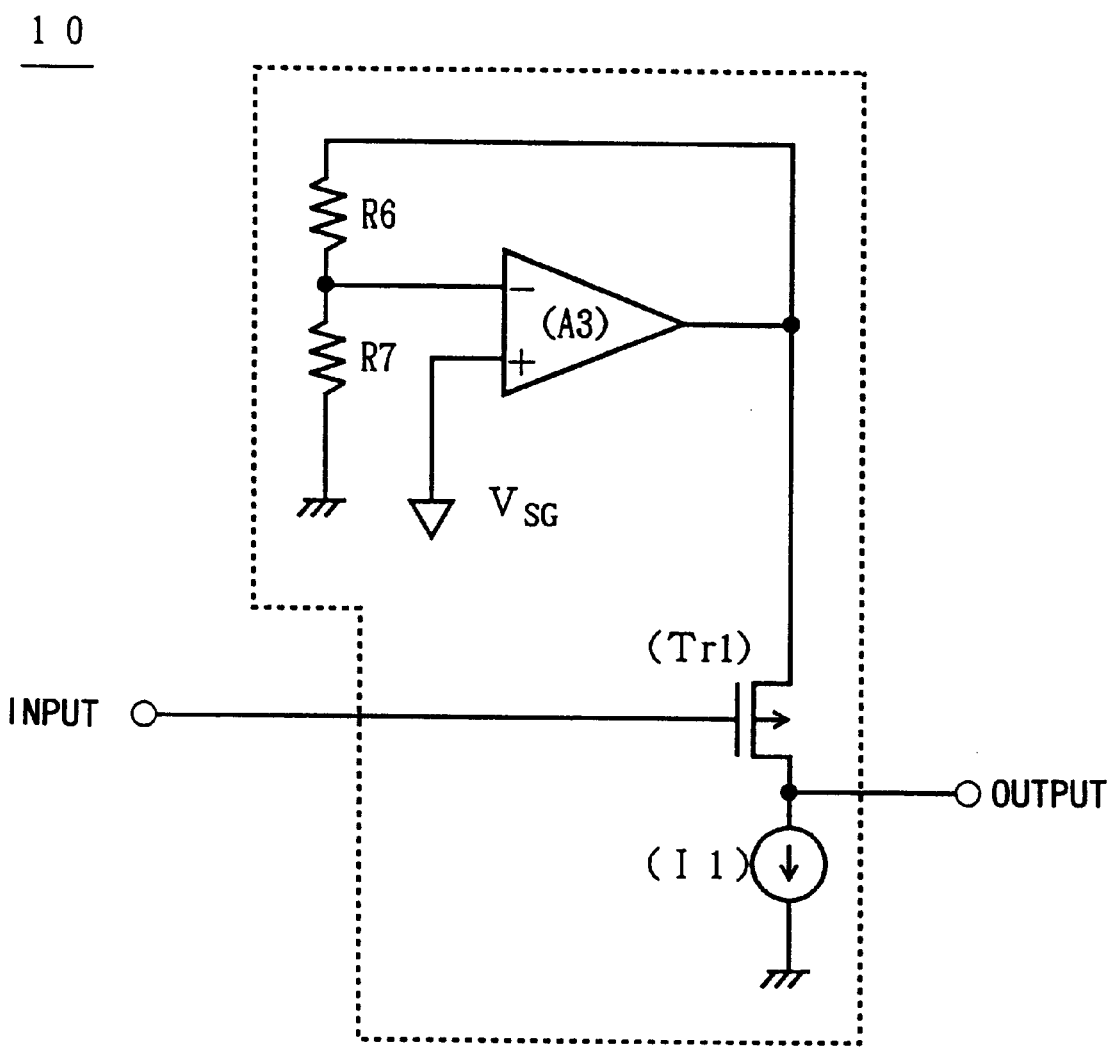
FIG. 5 is a circuit diagram of the limiter circuit according to the embodiment of the present invention.

FIG. 5 is a circuit diagram of the limiter circuit 10 according to the embodiment of the present invention.

The limiter circuit 10 of FIG. 5 includes an amplifier A3, a transistor Tr1, an electric-current source I1, a resistor R6, and a resistor R7.

The amplifier A3 has one input node thereof connected to the output node of the amplifier A3 via the resistor R6 and connected to the ground via the resistor R7. Here, the resistor R6 and the resistor R7 have an identical resistance. The amplifier A3 has the other input node thereof receiving the reference voltage VSG. As a result, the amplifier A3 outputs a voltage that is twice the reference voltage VSG.

The signal output from the amplifier A3 is supplied to the transistor Tr1. The transistor Tr1 outputs a signal from its output node such that the output signal varies in accordance with relationship between the signal supplied from the amplifier A3 and a signal supplied from its input node.

Figure 6:
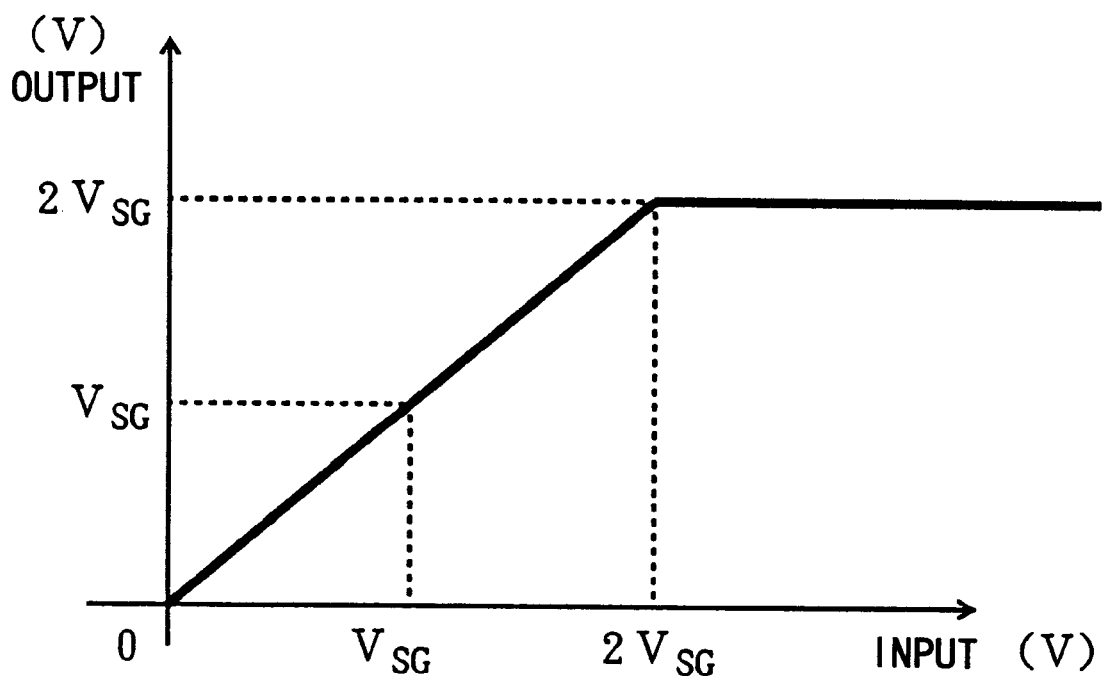
FIG. 6 is a chart showing a relation between an output signal and an input signal of the limiter circuit.

FIG. 6 is a chart showing a relation between the output signal and the input signal of the limiter circuit 10.

As shown in FIG. 6, the limiter circuit 10 produces an output signal that has the same voltage level as the input signal when the voltage level of the input signal is smaller than twice the reference voltage VSG. When the input signal has a voltage level greater than twice the reference voltage VSG, the limiter circuit 10 limits an output thereof to a level that is twice as high as the reference voltage VSG, thereby outputting a signal that is approximately equal to twice the reference voltage VSG.

In this manner, even when a signal input to the input terminal exceeds a threshold level to clamp a signal output from the amplifier A1, the average voltage V2 becomes substantially equal to the reference voltage VSG because the limiter circuit places a cap at a voltage level twice as high as the reference voltage level VSG. Since the average voltage and the reference voltage VSG are substantially the same, an output from the comparator C1 ends up having a substantially reduced duty ratio.

In the embodiment described above, the limiter circuit 10 has been described as a circuit having a configuration shown in FIG. 5. It should be noted, however, that the limiter circuit 10 is not limited to this particular embodiment, and any circuit can be used in place of the circuit of FIG. 5 as long as such a circuit can limit a voltage level of a signal supplied from the amplifier A1 to a level that is twice as high as the reference voltage VSG.

Further, the present invention is not limited to these embodiments, but various variations and modifications may be made without departing from the scope of the present invention.

The present application is based on Japanese priority application No. 11-074473 filed on Mar. 18, 1999, with the Japanese Patent Office, the entire contents of which are hereby incorporated by reference.

What is claimed is:

1. A device for amplifying a signal, comprising:
   a first amplifier which amplifies an input signal with reference to a reference voltage level to generate an amplified signal;
   a limiter circuit which limits an upper end of the amplified signal to a level twice as high as the reference voltage level so as to output a limited amplified signal;
   a second amplifier which amplifies the limited amplified signal with reference to an average of the limited amplified signal; and a comparator which compares an output of said second amplifier with the reference voltage level to output a result of the comparison.

2. The device as claimed in claim 1, wherein the reference voltage level is lower than half of a power voltage level which drives said device.

3. The device as claimed in claim 1, wherein said limiter circuit includes:

a third amplifier which generates a high voltage level twice as high as the reference voltage level; and a circuit element which passes from an input thereof to an output thereof the amplified signal of said first amplifier when the amplified signal is smaller than the high voltage level, and outputs at the output thereof the high voltage level when the amplified signal is greater than the high voltage level.

4. The device as claimed in claim 3, wherein said circuit element is a transistor.

5. A circuitry connected between a first amplifier and a second amplifier where the first amplifier amplifies a signal with reference to a reference voltage level to output an amplified signal, and the second amplifier amplifies an output signal of said circuit with reference to an average of the output signal, said circuitry comprising a circuit which limits an upper end of the amplified signal to a level twice as high as the reference voltage level so as to supply a limited amplified signal to the second amplifier as the output signal.

6. The circuitry as claimed in claim 5, wherein the reference voltage level is lower than half of a power voltage level which drives said circuitry and said first and second amplifiers.

7. The circuitry as claimed in claim 5, wherein said circuit includes:

a third amplifier which generates a high voltage level twice as high as the reference voltage level; and a circuit element which passes from an input thereof to an output thereof the amplified signal of said first amplifier when the amplified signal is smaller than the high voltage level, and outputs at the output thereof the high voltage level when the amplified signal is greater than the high voltage level.

8. The device as claimed in claim 7, wherein said circuit element is a transistor.

9. A method of using a limiter circuit in an amplifier unit, comprising the steps of:

providing the limiter circuit between a first amplifier and a second amplifier where the first amplifier amplifies a signal with reference to a reference voltage level to output an amplified signal, and the second amplifier amplifies an output signal of said limiter circuit with reference to an average of the output signal; and utilizing said limiter circuit to limit an upper end of the amplified signal to a level twice as high as the reference voltage level so as to supply a limited amplified signal to the second amplifier as the output signal.

10. The method as claimed in claim 9, further comprising a step of setting the reference voltage level to a level that is lower than half of a power voltage level that drives said limiter circuit and said first and second amplifiers.

* * * * *